(12) United States Patent
Wagiman et al.

(10) Patent No.: US 12,199,019 B2
(45) Date of Patent: Jan. 14, 2025

(54) SEMICONDUCTOR PACKAGE

(71) Applicant: Infineon Technologies AG, Neubiberg (DE)

(72) Inventors: Mohamad Yazid Bin Wagiman, Singapore (SG); Romel Solanoy Lazala, Singapore (SG); Eko Susilo, Singapore (SG); Prasanna Kumar Vishwanathan, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 140 days.

(21) Appl. No.: 17/209,821

(22) Filed: Mar. 23, 2021

(65) Prior Publication Data

US 2021/0305135 A1    Sep. 30, 2021

(30) Foreign Application Priority Data

Mar. 24, 2020   (DE) ................. 10 2020 108 114.6

(51) Int. Cl.
| | | |
|---|---|---|
| *H01L 23/495* | (2006.01) | |
| *H01L 21/48* | (2006.01) | |
| *H01L 21/56* | (2006.01) | |
| *H01L 23/31* | (2006.01) | |

(52) U.S. Cl.
CPC .... *H01L 23/49517* (2013.01); *H01L 21/4842* (2013.01); *H01L 21/56* (2013.01); *H01L 23/3107* (2013.01)

(58) Field of Classification Search
CPC .......... H01L 23/49517; H01L 21/4842; H01L 21/56; H01L 23/3107

USPC ....................................................... 257/676
See application file for complete search history.

(56) References Cited

U.S. PATENT DOCUMENTS

| | | | |
|---|---|---|---|
| 9,922,910 | B2* | 3/2018 | Otremba ............. H01L 23/4006 |
| 10,269,639 | B2* | 4/2019 | Koshimizu ....... H01L 21/67092 |
| 10,373,897 | B2* | 8/2019 | Otremba ........... H01L 23/49503 |
| 2009/0057863 | A1 | 3/2009 | Chow et al. |
| 2009/0140407 | A1 | 6/2009 | Chow et al. |
| 2010/0308448 | A1 | 12/2010 | Murakami |
| 2010/0320592 | A1 | 12/2010 | Takano et al. |
| 2012/0012992 | A1* | 1/2012 | Murakami ............. H01L 24/32 257/676 |
| 2013/0334674 | A1 | 12/2013 | Zheng |
| 2015/0001699 | A1 | 1/2015 | Funatsu et al. |

(Continued)

FOREIGN PATENT DOCUMENTS

| | | |
|---|---|---|
| JP | S61-263143 | 11/1986 |
| JP | H02-292835 | 12/1990 |

(Continued)

*Primary Examiner* — Kimberly N Rizkallah
*Assistant Examiner* — Dilinh P Nguyen
(74) *Attorney, Agent, or Firm* — Dicke, Billig & Czaja, PLLC (57) ABSTRACT

A semiconductor package is disclosed. In one example, the semiconductor package comprises a semiconductor chip, a molded body encapsulating the semiconductor chip and comprising a top face and an opposing bottom face and four side faces connecting the top and bottom faces, and a plurality of electrical contacts arranged on two of the side faces of the molded body, wherein the other two side faces are metal-free side faces, and wherein the molded body comprises a cut surface at no more than one of the side faces.

7 Claims, 5 Drawing Sheets

(56) References Cited

U.S. PATENT DOCUMENTS

| | | | |
|---|---|---|---|
| 2015/0144389 A1 | 5/2015 | Lee et al. | |
| 2016/0190352 A1* | 6/2016 | Tsukagoshi | H01L 23/49838 257/432 |
| 2021/0111103 A1* | 4/2021 | Chien | H01L 23/49513 |

FOREIGN PATENT DOCUMENTS

| | | |
|---|---|---|
| JP | H03-229431 | 10/1991 |
| KR | 2002-0039933 | 5/2002 |

* cited by examiner

SEMICONDUCTOR PACKAGE

CROSS-REFERENCE TO RELATED APPLICATION

This Utility Patent application claims priority to German Patent Application No. 10 2020 108 114.6, filed Mar. 24, 2020, which is incorporated herein by reference.

TECHNICAL FIELD

This disclosure relates in general to a semiconductor package as well as to a method for fabricating a semiconductor package.

BACKGROUND

Semiconductor packages may have to meet strict requirements concerning their electrical properties. For example, semiconductor packages may be required to exhibit a certain minimum creepage distance. A contamination with metal particles on the surface of a molded body of a semiconductor package as well as exposed metal parts, e.g. exposed leadframe parts, may negatively affect the creepage distance. Furthermore, there may be a requirement to protect exposed metal parts of semiconductor packages, e.g. electrical contacts, from oxidation and corrosion due to exposure to environment. The automotive sector may be an example of a field of application which may have the above described requirements. It may therefore be desirable to ensure that a semiconductor package can reliably provide a minimum creepage distance and a proper oxidation protection. Improved semiconductor packages and improved methods for fabricating semiconductor packages may help with solving these and other problems.

The problem on which the invention is based is solved by the features of the independent claims. Further advantageous examples are described in the dependent claims.

SUMMARY

Various aspects pertain to a semiconductor package comprising a semiconductor chip, a molded body encapsulating the semiconductor chip and comprising a top face and an opposing bottom face and four side faces connecting the top and bottom faces, and a plurality of electrical contacts arranged on two of the side faces of the molded body, wherein the other two side faces are metal-free side faces, and wherein the molded body comprises a cut surface at no more than one of the side faces.

Various aspects pertain to a method for fabricating a semiconductor package, wherein the method comprises providing a leadframe comprising a die carrier, a plurality of electrical contacts, four dummy leads and a frame, wherein the die carrier and the plurality of electrical contacts are connected to the frame by the four dummy leads, arranging a semiconductor chip on the die carrier, molding over the semiconductor chip and the die carrier, thereby fabricating a molded body, the molded body comprising a top face and an opposing bottom face and four side faces connecting the top and bottom faces, wherein the plurality of electrical contacts is exposed on two of the side faces and wherein the other two side faces are metal-free side faces that do not come into contact with the leadframe, covering the exposed electrical contacts with a coating, and singulating the semiconductor package from the frame by cutting the four dummy leads.

BRIEF DESCRIPTION OF THE DRAWINGS

The accompanying drawings illustrate examples and together with the description serve to explain principles of the disclosure. Other examples and many of the intended advantages of the disclosure will be readily appreciated as they become better understood by reference to the following detailed description. The elements of the drawings are not necessarily to scale relative to each other. Identical reference numerals designate corresponding similar parts.

DETAILED DESCRIPTION

In the following detailed description, reference is made to the accompanying drawings. It may be evident, however, to one skilled in the art that one or more aspects of the disclosure may be practiced with a lesser degree of the specific details. In other instances, known structures and elements are shown in schematic form in order to facilitate describing one or more aspects of the disclosure. In this regard, directional terminology, such as "top", "bottom", "left", "right", "upper", "lower" etc., is used with reference to the orientation of the Figure(s) being described.

In addition, while a particular feature or aspect of an example may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements cooperate or interact with each other regardless whether they are in direct physical or electrical contact, or they are not in direct contact with each other; intervening elements or layers may be provided between the "bonded", "attached", or "connected" elements. However, it is also possible that the "bonded", "attached", or "connected" elements are in direct contact with each other. Also, the term "exemplary" is merely meant as an example, rather than the best or optimal.

The semiconductor chip(s) mentioned further below may be of different types, may be manufactured by different technologies and may include for example integrated circuits and/or passives, logic integrated circuits, control circuits, microprocessors, memory devices, etc.

The examples of a semiconductor package described in the following may use various types of semiconductor chips or circuits incorporated in the semiconductor chips, among them AC/DC or DC/DC converter circuits, power MOSFETs, power Schottky diodes, JFETs (Junction Gate Field Effect Transistors), power bipolar transistors, power integrated circuits, etc. The semiconductor chip(s) may have contact pads (or electrodes) which allow electrical contact to be made with the integrated circuits included in the semiconductor chip(s). The electrodes may be arranged all at only one main face of the semiconductor chip(s) or at both main faces of the semiconductor chip(s).

The semiconductor chip(s) may be covered with an encapsulation material in order to be embedded in an encapsulant after being bonded to a device carrier (substrate). The encapsulation material may be electrically insulating. The encapsulation material may comprise or be made of any appropriate plastic or polymer material such as, e.g., a duroplastic, thermoplastic or thermosetting material, and may e.g. contain filler materials. Various techniques may be employed to encapsulate the semiconductor chip(s) with the encapsulation material, for example any suitable molding technique.

Figure 1A:
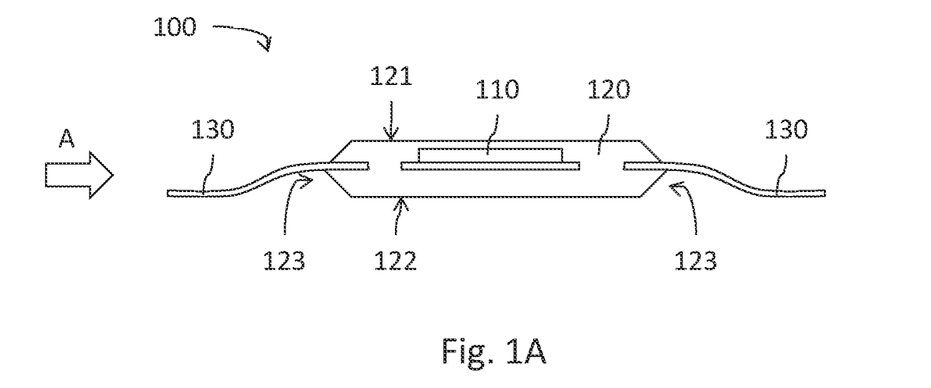
FIGS. 1A to 1C show a semiconductor package comprising a plurality of electrical contacts, a molded body and a cut surface at no more than one of the side faces of the molded body.
Figure 1B:
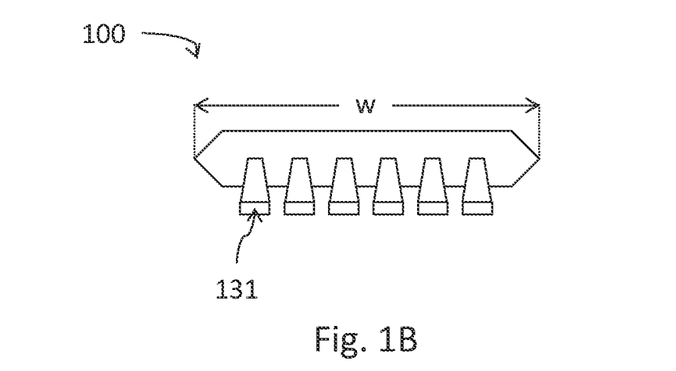
Figure 1C:
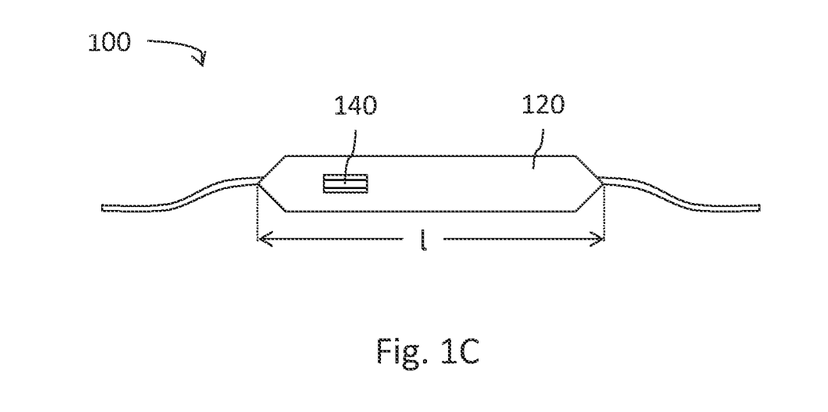

FIG. 1A shows a sectional view of a semiconductor package 100 that comprises a semiconductor chip 110, a molded body 120 and a plurality of electrical contacts 130. FIG. 1B shows a view of the semiconductor package 100 along the arrow A in FIG. 1A. FIG. 1C shows the same view as FIG. 1A, however in FIG. 1C the molded body 120 is depicted opaque.

In semiconductor package 100 the molded body 120 encapsulates the semiconductor chip 110. For example, the molded body 120 may encapsulate the semiconductor chip 110 on all sides. The molded body 120 comprises a top face 121 and an opposing bottom face 122 and four side faces 123 connecting the top and bottom faces 121, 122.

The plurality of electrical contacts 130 may e.g. be arranged on two of the four side faces 123 of the molded body 120, for example on opposing ones of the four side faces 123. The other two side faces 123 (i.e. those side faces 123 that do not comprise any electrical contacts 130) are metal-free side faces. "Metal-free" in particular may mean that the respective side face does not comprise any form of metal part, like a metal contact, a metal stud, a metal peg, remains of a metal tie-bar, etc. that is exposed on the respective side face. In other words, a metal-free side face is comprised solely of the molded body 120 but it does not comprise any exposed metal.

Furthermore, "metal-free" may mean that the surface of the molded body 120 on the respective side face is free of contamination with metal particles. In particular, the molded body 120 may be fabricated by using a molding tool, wherein a molding cavity is formed by a top part and a bottom part. The side faces 123 of the molded body may comprise a small ridge at the interface between the top part and the bottom part of the molding tool as described in greater detail further below with respect to FIGS. 4A and 4B. "Metal-free" may mean that this ridge is free of any metal residue like leadframe residue.

As shown in FIG. 1C, the molded body 120 may comprise a cut surface 140. The cut surface 140 may e.g. be the place of an inlet or an outlet of the molding cavity (e.g. allowing mold material to flow into the molding cavity or allowing gas to flow out of the molding cavity, compare FIGS. 5A and 5B). After the mold material in the molding cavity has been cured, waste material filling the inlet or outlet may be cut off or stamped off, leaving the cut surface 140.

The molded body 120 comprises a cut surface 140 at no more than one of the side faces 123. The other side faces 123, in particular the side face 123 opposite the side face 123 with the cut surface 140 are free of any cut surface.

The cut surface 140 may for example be arranged on one of the two side faces 123 that do not comprise the electrical contacts 130. The cut surface 140 may have any suitable size and may for example occupy no more than 30%, no more than 20%, or no more than 10% of the surface area of the respective side face 123.

The semiconductor chip 110 may e.g. be a power semiconductor chip, configured to operate with a high voltage and/or a high electrical current. According to an example, the semiconductor chip 110 may be arranged on one or more of the electrical contacts 130. However, it is also possible that the semiconductor chip 110 is arranged on a die carrier that is not contiguous with an electrical contact 130 (as shown in the example of FIG. 1A). The semiconductor package 100 may comprise a single semiconductor chip 110 or it may comprise more than one semiconductor chip 110. The electrical contacts 130 may e.g. be coupled to load electrodes (e.g. a source electrode and a drain electrode or an emitter electrode and a collector electrode) as well as to a control electrode (e.g. a gate electrode) of the semiconductor chip 110.

The molded body 120 may e.g. comprise a polymer material or a resin. According to an example, the molded body 120 may also comprise a filler material, which may e.g. be configured to reduce the thermal resistance of the molded body 120.

The semiconductor package 100 may for example be a small outline package. Neighboring electrical contacts 130 may for example have a distance of 1.27 mm. The side faces 123 without electrical contacts 130 may have a length l of 7 mm or more. The side faces 123 with electrical contacts may e.g. have a width w of 5 mm or more, 8 mm or more, or 10 mm or more.

The electrical contacts 130 may for example have a gull wing shape, wherein an outer tip of the electrical contacts 130 is bent downwards as shown in FIGS. 1A and 1C. The electrical contacts 130 may comprise or consist of a metal like Al, Cu, Fe or any other suitable material.

Figure 2:
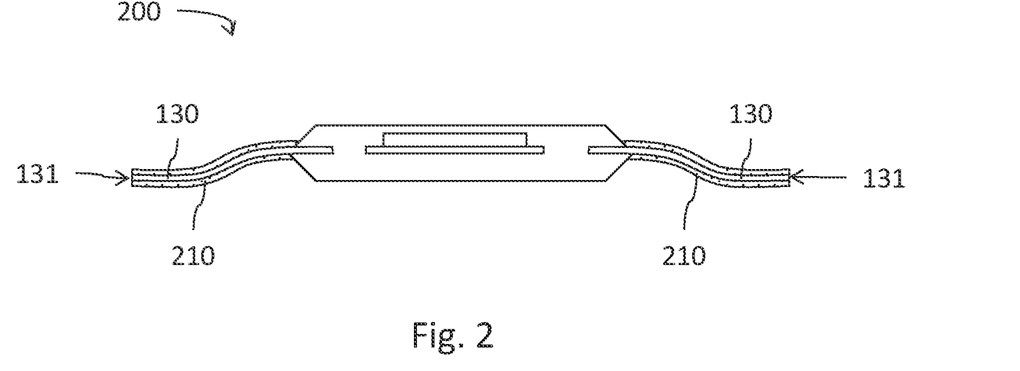
FIG. 2 shows a sectional view of a further semiconductor package comprising a coating that covers the electrical contacts.

FIG. 2 shows a sectional view of a semiconductor package 200, which may be similar or identical to the semiconductor package 100, except for the differences described in the following.

In addition to the parts described with respect to the semiconductor package 100, the semiconductor package 200 further comprises a coating 210 covering the electrical contacts 130. The coating 210 may in particular cover every one of the electrical contacts 130. The coating 210 may for example be a Sn coating, a NiPd coating, a NiAu coating or a coating comprising any other suitable metal or metal alloy. The coating 210 may for example be deposited on the electrical contacts 130 galvanically, by using vapor deposition or by using any other suitable technique.

The coating 210 completely covers every surface of each electrical contact 130, except for an end face 131 at the tip of each electrical contact which is not covered by the coating 210. In other words, the material of the electrical contacts 130 is exposed to the outside solely at the end faces 131. The end faces 131 are not covered by the coating 210 because the electrical contacts 130 are still connected to a connecting bar at the end faces 131 during deposition of the coating 210 (this is explained in greater detail further below with respect to FIGS. 3C and 3D).

According to an example, the coating 210 may be configured to act as a protection layer for the electrical contacts 130, in particular as an oxidation prevention layer. The coating 210 may have any suitable thickness, e.g. a thickness in the nanometer range or a thickness in the micrometer range.

FIGS. 3A to 3D show a semiconductor package 300 in various stages of fabrication. The semiconductor package 300 may be similar or identical to the semiconductor packages 100 and 200.

Figure 3A:
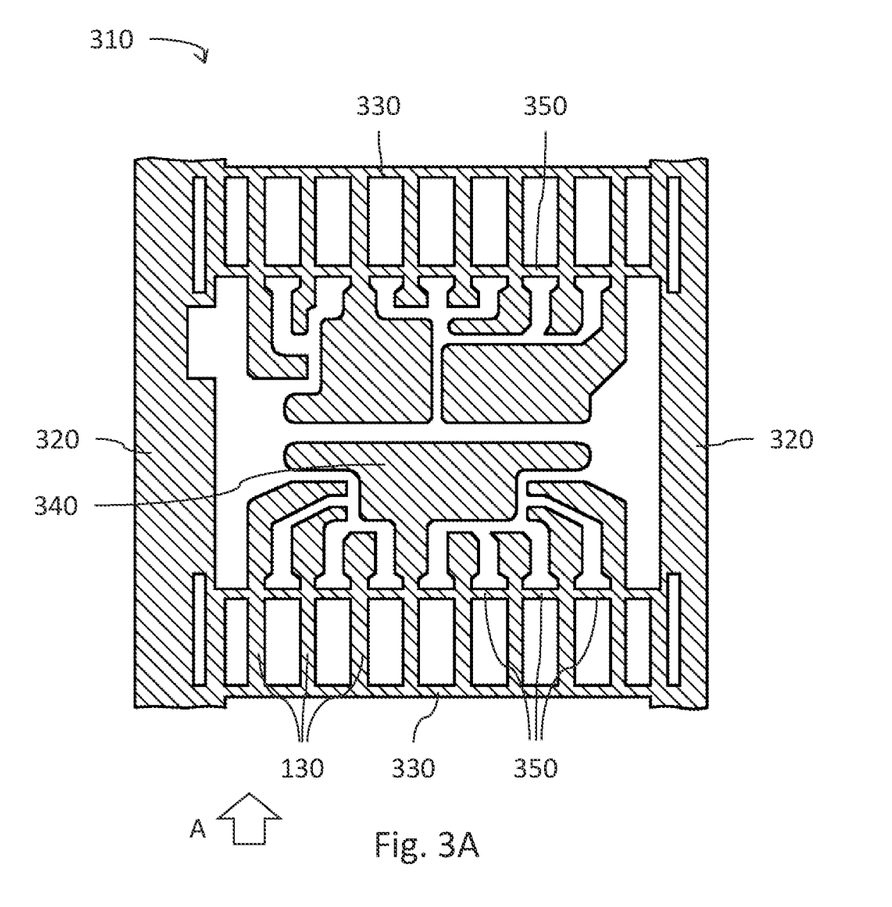
FIGS. 3A to 3D show a further semiconductor package in various stages of fabrication.

FIG. 3A shows a leadframe 310 prior to arranging the semiconductor chip 110 on the leadframe, encapsulating the semiconductor chip 110 with the molded body 120 and singulating the semiconductor package 300 from the rest of the leadframe 310.

The leadframe 310 comprises the electrical contacts 130, a frame 320 and connecting bars 330. The leadframe 310 may further comprise one or more die pads 340 for one or more semiconductor chips 110.

The frame 320 may be arranged left and right of the other parts of the leadframe 310 and it may run along the length of the leadframe stripe. The frame 320 may be the part of the leadframe stripe that connects consecutive sections of the leadframe that are used in the fabrication of individual semiconductor packages 300.

The electrical contacts 130 are connected to the frame 320 by the connecting bars 330. The connecting bars 330 are connected to the electrical contacts 130 at the tip of each electrical contact 130 and the connecting bars 330 may be arranged essentially perpendicular to the electrical contacts 130 and the frame 320.

According to an example, the electrical contacts 130 may further be connected to the frame 320 by connecting pieces 350. The connecting pieces 350 may be arranged essentially parallel to the connecting bars 330. In some embodiments, the connecting pieces 350 may take the form of a dambar. The connecting pieces 350 may be connected to the electrical contacts 130 at lateral sides of the electrical contacts 130. During fabrication of the semiconductor package 300, the connecting pieces 350 may be cut away. However, after the connecting pieces 350 have been cut away the electrical contacts 130 are still connected to the frame 320 by the connecting bars 330.

Figure 3B:
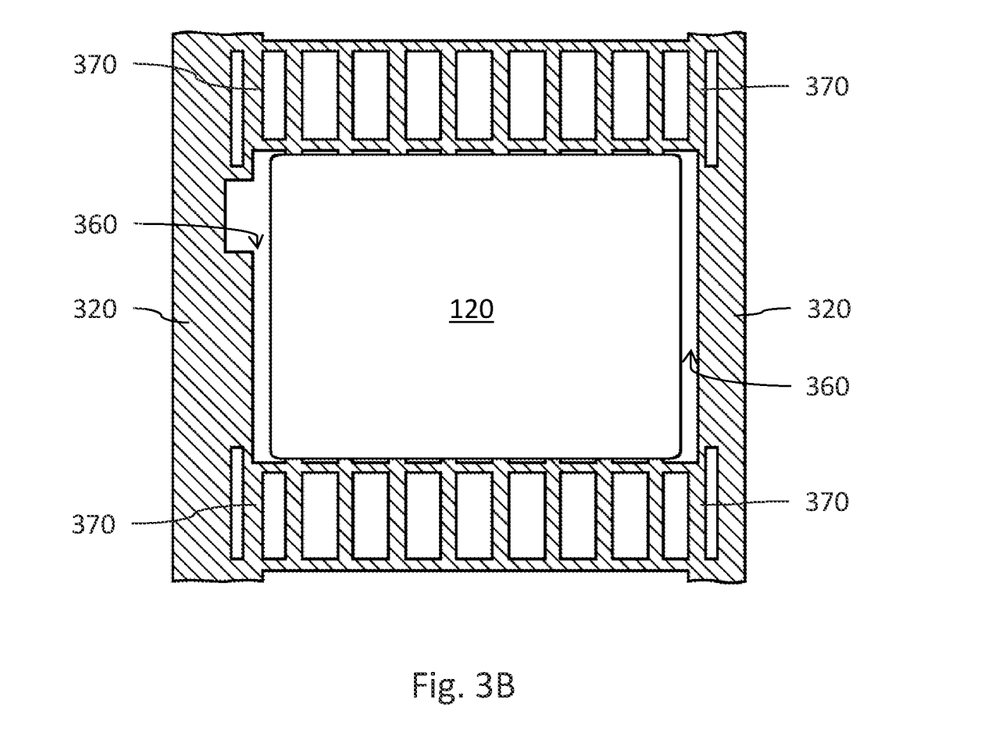

FIG. 3B shows a stage of fabrication of the semiconductor package 300, wherein the one or more semiconductor chips 110 have been arranged on the die pad(s) 340 and the molded body 120 has been formed.

As shown in FIG. 3B, the molded body 120 does not come into contact with the frame 320. Instead, a gap 360 is arranged between the molded body 120 and the frame 320, completely separating the two. In particular, the leadframe 310 does not comprise any form of tie bar which at any point during the fabrication of the semiconductor package 300 bridges the gap 360. The gap 360 may for example have a width of 200 µm or more, 300 µm or more, 400 µm or more, or 500 µm or more.

Figure 3C:
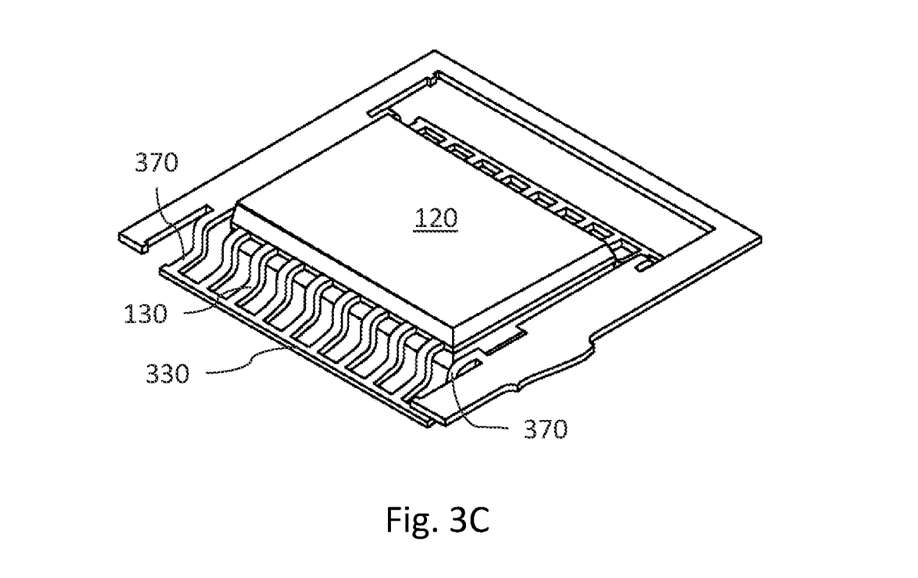

FIG. 3C shows the semiconductor package 300 in a stage of fabrication, wherein the connecting pieces 350 have been cut away. The electrical contacts 130 (and by extension, the semiconductor package 300) are connected to the frame 320 by the connecting bars 330 and by dummy leads 370, wherein a dummy lead 370 is arranged at each end of each connecting bar 330. A first end of each dummy lead 370 is connected to one of the connecting bars 330 and an opposing second end of each dummy lead 370 is connected to the frame 320.

As shown in FIG. 3C, the dummy leads 370 may essentially have the same shape and the same spatial orientation as the electrical contacts 130. The only difference between the dummy leads 370 and the electrical contacts 130 may be that the second end of each dummy lead 370 is attached to the frame 320, whereas the second end of each electrical contact 130 is arranged within the molded body 120.

The coating 210 may be deposited on the electrical contacts 130 in the state of fabrication shown in FIG. 3C. Since the connecting pieces 350 have been cut away beforehand, the coating 210 may cover the surface of the electrical contacts 130 completely, except for the tips where the electrical contacts 130 are connected to the connecting bar 330.

Furthermore, the electrical contacts 130 may be subjected to a forming process, for example a stamping process, in order to obtain a gull wing shape, as shown in FIG. 3C. This forming process may e.g. be performed prior to depositing the coating 210. The dummy leads 370 may also be subjected to the forming process and may therefore obtain the same gull wing shape as the electrical contacts 130.

Figure 3D:
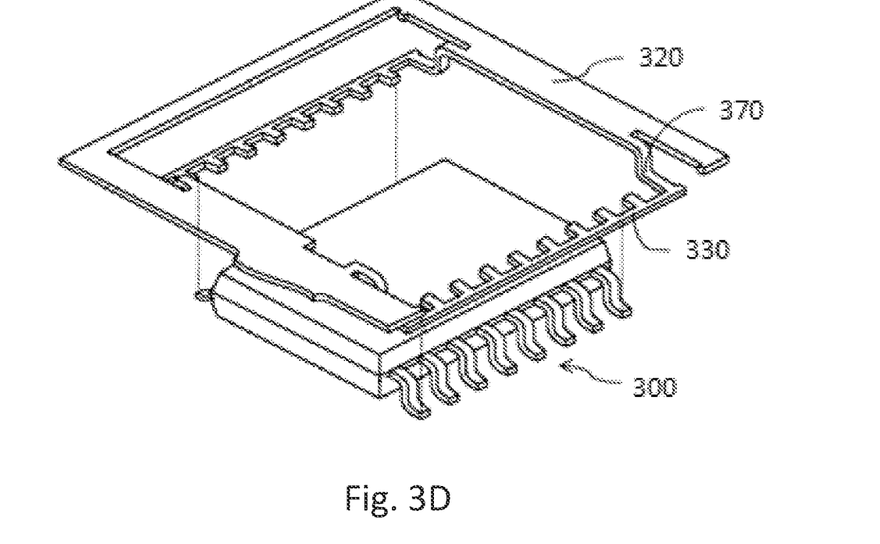

FIG. 3D shows the semiconductor package 300 after singulation from the frame 320. Singulation comprises cutting the electrical contacts 130 away from the connecting bars 330. Since in the state of fabrication shown in FIG. 3C the semiconductor package 300 is connected to the frame 320 solely by the connecting bars 330 and dummy leads 370, the singulation process does not require cutting at any other location.

Figure 4A:
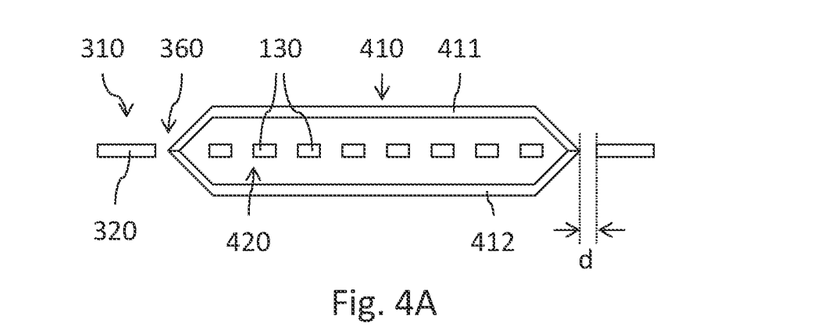
FIGS. 4A and 4B show the fabrication of a molded body of a semiconductor package, wherein the molded body does not come into contact with an outer frame part of a leadframe.

FIG. 4A shows a view of the leadframe 310 along the arrow A in FIG. 3A. In FIG. 4A a molding tool 410 is arranged around part of the leadframe 310. The molding tool 410 forms a molding cavity 420, wherein the electrical contacts 130 are arranged within the molding cavity 420 and the frame 320 is arranged outside the molding cavity 420. A mold material may be allowed to flow into the molding cavity 420 in order to fabricate the molded body 120. For this purpose, the molding tool 410 may comprise a single opening, e.g. at a side face 123 of the molded body 120 (compare FIG. 5A).

The molding tool 410 may comprise an upper half 411 and a lower half 412, wherein both halves 411, 412 may be pressed together to form the molding cavity 420. In particular, the upper half 411 and the lower half 412 may touch within the gap 360 of the leadframe 310. The upper and lower halves 411, 412 may be arranged in the gap 360 such that they do not come into contact with the frame 320. Instead, the upper and lower halves 411, 412 may be spaced apart from the frame by a distance d>0. For this reason, mold material filling the molding cavity 420 does not come into contact with the frame 320. The leadframe 310 in particular comprises no tie bar reaching from the frame 320 into the molding cavity 420.

Figure 4B:
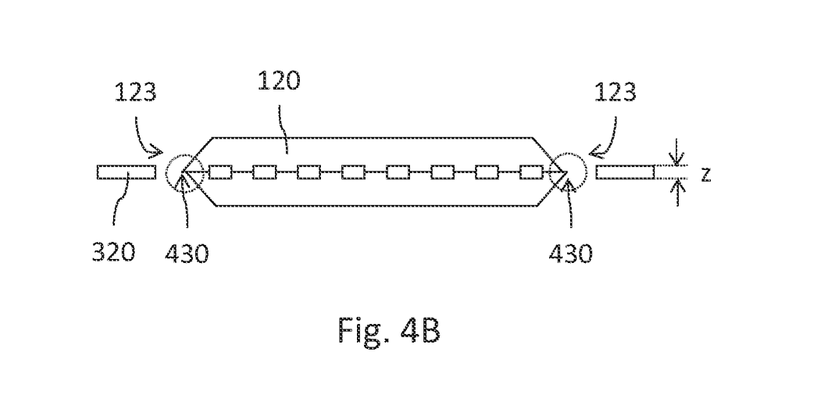

FIG. 4B shows the fabricated molded body 120 after the molding tool 410 has been removed. Since the frame 320 is not clamped between the two halves 411, 412 the molded body 120 does not comprise a pronounced mold flash in the plane of the leadframe 310. Instead, the molded body 120 may e.g. comprise no more than a thin ridge 430 at the interface of the upper and lower halves 411, 412. A thickness of the ridge 430 may be much smaller than a thickness z of the leadframe 310.

Since the molded body 120 does not come into contact with the frame 320, the side faces 123 of the molded body 120 without electrical contacts 130 may be free of any contamination with metal particles. Such a contamination would occur if the frame 320 was clamped between the two halves 411, 412 of the molding tool 410 such that the mold material comes into contact with the frame 320. After curing of the mold material, the frame 320 would have to be removed from the molded body 120, leaving behind a smear of metal particles on the surface of the molded body 120. Such a metal particle contamination could reduce the creepage distance of the semiconductor package to a value smaller than the length 1 of the semiconductor package (compare FIG. 1C).

Furthermore, since no tie bar connects the molded body 120 to the frame 320 no such tie bar has to be truncated or pulled out of the molded body 120. For this reason, the metal-free side faces 123 do not comprise any residues of such a tie bar, i.e. no truncated tie bar part and also no cavity where a tie bar used to be.

Figure 5A:
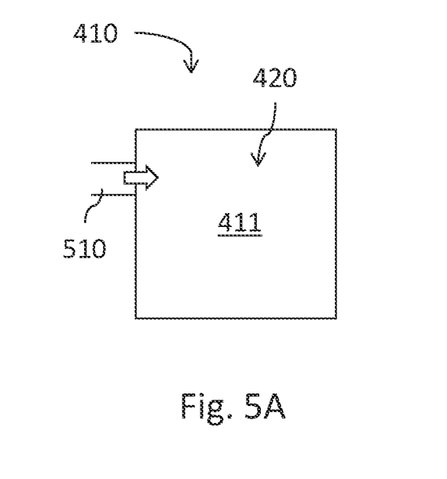
FIGS. 5A and 5B show a top down view of a molding tool and a molded body of a semiconductor package, obtained from molding with the molding tool.

FIG. 5A shows a schematic top down view of the molding tool 410. The molding tool 410 comprises a single inlet 510 connected to the cavity 420 and configured to allow a mold material flow into the cavity 420 as indicated by the arrow.

Figure 5B:
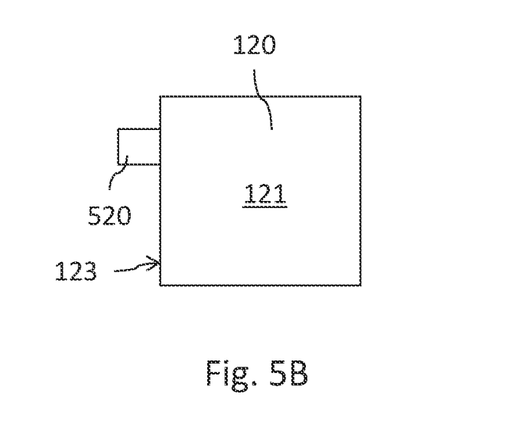

FIG. 5B shows the molded body 120 after the mold material has been cured and the molding tool 410 has been removed. At the location of the inlet 510 there is a protrusion 520 formed of excess mold material attached to the molded body 120. Removing the protrusion 520 from the molded body 120 may produce the cut surface 140 in the respective side face 123 of the molded body 120 (compare FIG. 1C). The protrusion 520 may for example be cut away or stamped away.

The protrusion 520 may e.g. be removed while the semiconductor package 300 is still connected to the frame 320 or it may be removed after the semiconductor package has been singulated from the frame 320.

Since the semiconductor package 300 is connected to the leadframe 310 by the dummy leads 370 prior to singulation, the protrusion 520 does not have to be configured to mechanically couple the semiconductor package 300 to the frame 320. It is in particular not necessary to provide several protrusions, e.g. arranged on opposing side faces 123 of the molded body 120, to mechanically couple the semiconductor package 300 to the frame 320 prior to singulation.

Not having more than one protrusion that needs to be removed may be beneficial because cutting or stamping the protrusion 520 may produce mold material particles which may sediment on the semiconductor package 300, for example on the electrical contacts 130. This may for example impair the electrical properties and/or the solderability of the electrical contacts 130.

Figure 6:
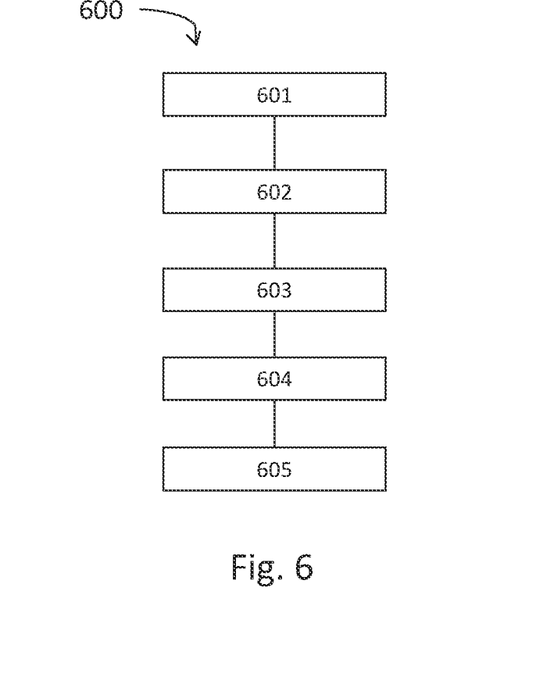
FIG. 6 is a flow chart of a method for fabricating a semiconductor package.

FIG. 6 is a flow chart of a method 600 for fabricating a semiconductor package according to one embodiment of this disclosure. The method 600 may for example be used to fabricate the semiconductor packages 100, 200 and 300.

The method 600 comprises at 601 an act of providing a leadframe comprising a die carrier, a plurality of electrical contacts, four dummy leads and a frame, wherein the die carrier and the plurality of electrical contacts are connected to the frame by the four dummy leads, at 602 an act of arranging a semiconductor chip on the die carrier, at 603 an act of molding over the semiconductor chip and the die carrier, thereby fabricating a molded body, the molded body comprising a top face and an opposing bottom face and four side faces connecting the top and bottom faces, wherein the plurality of electrical contacts is exposed on two of the side faces and wherein the other two side faces are metal-free side faces that do not come into contact with the leadframe, at 604 an act of covering the exposed electrical contacts with a coating, and at 605 an act of singulating the semiconductor package from the frame by cutting the four dummy leads.

The act of providing 601 the leadframe may for example comprise providing the leadframe 310 as shown in FIG. 3A. The act of arranging 602 a semiconductor chip may e.g. comprise arranging the semiconductor chip 110 on the die pad 340. The act of molding 603 may comprise fabricating the molded body 120 as e.g. shown in FIGS. 4A, 4B and FIGS. 5A, 5B.

According to an example, the act of molding 603 may be performed while the electrical contacts 130 are still connected to the frame 320 by the connecting pieces 350, as shown in FIGS. 3A and 3B.

The act of covering 604 may comprise covering the electrical contacts 130 with the coating 210 as described with respect to FIG. 2. The act of covering 604 may e.g. be performed after the act of molding 603. The act of covering 604 may e.g. be performed after the connecting pieces 350 have been removed. This way, the exposed electrical contacts 130 may be completely covered by the coating 210 except for the tips which are still connected to the connecting bars 330.

The act of singulating 605 may be performed after the act of covering 604. According to an example, an act of bending the electrical contacts 130 and the dummy leads 370 may be performed prior to the act of singulating 605 in order to obtain the gull wing shape shown e.g. in FIGS. 3D and 3C. The act of bending may e.g. be performed after the act of covering 604.

EXAMPLES

In the following, the semiconductor package and the method for fabricating a semiconductor package are further explained using specific examples.

Example 1 is a semiconductor package, comprising: a semiconductor chip, a molded body encapsulating the semiconductor chip and comprising a top face and an opposing bottom face and four side faces connecting the top and bottom faces, and a plurality of electrical contacts arranged on two of the side faces of the molded body, wherein the other two side faces are metal-free side faces, and wherein the molded body comprises a cut surface at no more than one of the side faces.

Example 2 is the semiconductor package of example 1, further comprising: a coating covering the electrical contacts such that no more than the tips of the contacts are left uncovered.

Example 3 is the semiconductor package of example 1 or 2, wherein the metal-free side faces are free of any smear with metal particles.

Example 4 is the semiconductor package of example 2, wherein the coating comprises or consists of Sn.

Example 5 is the semiconductor package of one of the preceding examples, wherein the metal-free side faces have a length of 7 mm or more.

Example 6 is the semiconductor package of one of the preceding examples, wherein the metal-free side faces are free of any cavity arranged in a plane comprising the electrical contacts.

Example 7 is the semiconductor package of one of the preceding examples, wherein the electrical contacts comprise or consist of Cu.

Example 8 is the semiconductor package of one of the preceding examples, wherein a length of the side faces comprising the electrical contacts is greater than a length of the metal-free side faces.

Example 9 is the semiconductor package of one of the preceding examples, wherein a creepage distance along the metal-free side faces is 8 mm or more.

Example 10 is the semiconductor package of one of the preceding examples, wherein a thickness of a mold flash at the metal-free side faces is smaller than a thickness of the electrical contacts, measured perpendicular to the top and bottom faces.

Example 11 is a method for fabricating a semiconductor package, the method comprising: providing a leadframe comprising a die carrier, a plurality of electrical contacts, four dummy leads and a frame, wherein the die carrier and the plurality of electrical contacts are connected to the frame by the four dummy leads, arranging a semiconductor chip on the die carrier, molding over the semiconductor chip and the die carrier, thereby fabricating a molded body, the molded body comprising a top face and an opposing bottom face and four side faces connecting the top and bottom faces, wherein the plurality of electrical contacts is exposed on two of the side faces and wherein the other two side faces are metal-free side faces that do not come into contact with the leadframe, covering the exposed electrical contacts with a coating, and singulating the semiconductor package from the frame by cutting the four dummy leads.

Example 12 is the method of example 11, wherein a gap is arranged between the metal-free side faces and the frame of the leadframe.

Example 13 is the method of example 11 or 12, wherein the plurality of electrical contacts is arranged in two rows along the respective side faces of the molded body, and wherein the four dummy leads are arranged at both ends of both rows.

Example 14 is the method of one of examples 11 to 13, wherein the four dummy leads are connected to the plurality of electrical contacts by connecting bars, the connecting bars being arranged at the tips of the electrical contacts and perpendicular to the electrical contacts and the four dummy leads.

Example 15 is the method of example 14, wherein during the covering of the electrical contacts with the coating the semiconductor package is mechanically coupled to the frame solely by the connecting bars and dummy leads.

Example 16 is the method of one of examples 11 to 15, further comprising: bending the plurality of electrical contacts and the four dummy leads such that the electrical contacts and the four dummy leads obtain a gull-wing shape.

Example 17 is the method of one of examples 11 to 16, wherein the electrical contacts are coated such that no more than the tips of the electrical contacts are left uncovered by the coating.

Example 18 is an apparatus comprising means for performing the method of one of examples 11 to 17.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

The invention claimed is:

1. A semiconductor package, comprising:
a semiconductor chip;
a molded body encapsulating the semiconductor chip and comprising a top face and an opposing bottom face and four side faces connecting the top and bottom faces; and
a plurality of electrical contacts arranged on two of the four side faces of the molded body,
wherein an other two of the four side faces are metal-free side faces,
a coating covering the plurality of electrical contacts such that no more than the tips of the plurality of electrical contacts are left uncovered, and
wherein the molded body comprises a cut surface only at one of the four side faces.

2. The semiconductor package of claim 1, further comprising:
a lead frame does not comprise a tie bar for supporting a die carrier of the lead frame, wherein the die carrier is molded inside the molded body.

3. The semiconductor package of claim 1, wherein the metal-free side faces are free of any smear with metal particles.

4. The semiconductor package of claim 1, wherein the metal-free side faces are free of any cavity arranged in a plane comprising the plurality of electrical contacts.

5. The semiconductor package of claim 1, wherein a creepage distance along the metal-free side faces is 8 mm or more.

6. The semiconductor package of claim 1, wherein a thickness of a mold flash at the metal-free side faces is smaller than a thickness of the plurality of electrical contacts, measured perpendicular to the top and bottom faces.

7. The semiconductor package of claim 1, wherein the cut surface occupies no more than 30% of a surface area of a respective one of the four side faces.

* * * * *